United States Patent [19]

Yang et al.

[11] Patent Number: 5,079,294

[45] Date of Patent: * Jan. 7, 1992

[54] RUBBER-MODIFIED CYANATE ESTER RESINS AND POLYTRIAZINES DERIVED THEREFROM

[75] Inventors: Philip C. Yang, Midland; Dale M. Pickelman, Auburn, both of Mich.

[73] Assignee: The Dow Chemical Company, Midland, Mich.

[*] Notice: The portion of the term of this patent subsequent to Jan. 16, 2007 has been disclaimed.

[21] Appl. No.: 434,220

[22] Filed: Nov. 13, 1989

Related U.S. Application Data

[63] Continuation-in-part of Ser. No. 79,378, Jul. 30, 1987, Pat. No. 4,894,414.

[51] Int. Cl.$^5$ .............................................. C08L 67/06
[52] U.S. Cl. ........................................ 525/66; 525/64
[58] Field of Search ..................................... 525/64, 66

[56] References Cited

U.S. PATENT DOCUMENTS

| 4,396,745 | 8/1983 | Ikeguchi | 525/374 |
| 4,403,073 | 9/1983 | Ikeguchi | 525/374 |
| 4,404,330 | 9/1983 | Ikeguchi | 525/374 |
| 4,503,186 | 3/1985 | Sugio et al. | 525/63 |
| 4,894,414 | 1/1990 | Yang et al. | 525/64 |

FOREIGN PATENT DOCUMENTS

| 3117902 | 4/1982 | Fed. Rep. of Germany . |
| 56-157454 | 3/1981 | Japan . |
| 56-157424 | 4/1981 | Japan . |
| 56-148547 | 5/1981 | Japan . |
| 56-157425 | 8/1981 | Japan . |
| 56-147452 | 10/1981 | Japan . |
| 56-141310 | 12/1981 | Japan . |
| 57-174346 | 1/1982 | Japan . |
| 57-177051 | 3/1982 | Japan . |
| 57-3817 | 7/1982 | Japan . |
| 57-197892 | 10/1982 | Japan . |

Primary Examiner—John C. Bleutge
Assistant Examiner—Thomas Hamilton, III

[57] ABSTRACT

Polytriazines exhibiting improved toughness without sacrificing heat resistance are prepared by curing a cyanate ester resin having dispersed therein resin-insoluble rubber particles grafted with a resin-soluble polymer. The resin-soluble polymer stabilizes the rubber particles and maintains the particles in an essentially discrete, nonagglomerated form.

35 Claims, No Drawings

RUBBER-MODIFIED CYANATE ESTER RESINS AND POLYTRIAZINES DERIVED THEREFROM

CROSS-REFERENCE TO COPENDING APPLICATION

This Application is a continuation-in-part of copending application Ser. No. 079,378, filed July 30, 1987, now U.S. Pat. No. 4,894,414 which is incorporated herein by reference.

BACKGROUND OF THE INVENTION

This invention relates to rubber-modified cyanate ester resins and polytriazines prepared therefrom. It also relates to a process for preparing the rubber-modified cyanate ester resins and polytriazines.

Polytriazines are well-known thermosets. They possess good heat resistance, hardness, electrical properties, dimensional stability, corrosion resistance, and chemical resistance. Polytriazines are useful as adhesives and as coatings for substrates. They are also useful for the preparation of advanced composites and for the preparation of electrical laminates.

Attempts have been made to toughen or reinforce polytriazines for demanding electronic and aerospace applications by incorporating liquid or elastic rubbers, such as polybutadiene and carboxyl-terminated butadieneacrylonitrile copolymers, into cyanate ester resins before cure. See, for example, U.S. Pat. Nos. 4,403,073; 4,404,330; 4,396,745; and 4,503,186. The liquid or elastic rubber is mixed with a cyanate ester resin or the prepolymer of the resin and the resulting mixture is cured to form the rubber-modified polytriazine.

Unfortunately, the liquid or elastic rubber is soluble in the cyanate ester resin. The formation of discrete rubber particles in the polytriazine will therefore depend on the degree of solubility of the rubber in the polytriazine. If the rubber is highly soluble, then discrete rubber particles will not form and the heat resistance of the rubber-modified polytriazine as measured by the glass transition temperature will be severely reduced because the rubber plasticizes the polytriazine. If the rubber is only partially soluble, then discrete rubber particles may form but the particle size, particle size distribution and particle composition will be uncontrollable. The heat resistance of the rubber-modified polytriazine will be reduced because of the presence of partially dissolved rubber in the polytriazine matrix. Additionally, the heat resistance and other important properties of the polytriazine will vary with the morphology of the rubber incorporated into the polytriazine.

In view of the unsuccessful attempts at preparing rubber-modified polytriazines without significantly sacrificing heat resistance, and in view of the unsuccessful attempts at controlling the morphology of the rubber incorporated into the polytriazine, it would be desirable to prepare a rubbermodified polytriazine exhibiting acceptable heat resistance and a controlled morphology. It would also be desirable to prepare a rubber-modified cyanate ester resin that could be cured to form the desired rubber-modified polytriazine.

SUMMARY OF THE INVENTION

One aspect of the present invention is a rubber-modified cyanate ester resin comprising a major portion of cyanate ester resin and a minor portion of grafted rubber additive which contains:
1. resin-insoluble rubber particles;
2. resin-soluble polymer moieties grafted to the resin-insoluble rubber particles; and
3. optionally ungrafted resin-soluble polymer moieties wherein the concentration of grafted rubber additive and the ratio of components is such that:
the concentration of resin-insoluble rubber particles in the rubber-modified cyanate ester resin is at least about 6 weight percent,
the concentration of ungrafted resin-soluble polymer in the rubber-modified cyanate ester resin is at most about 10 weight percent,
the rubber particles are maintained in a discrete spaced apart relationship to each other, and
the grafted rubber additive and cyanate ester resin can be dispersed in a compatible solvent.

A second aspect of the invention is a rubber-modified polytriazine of a cyanate ester resin comprising a polytriazine continuous phase, and a discontinuous phase of the grafted rubber additive previously described.

A third aspect of the present invention is a rubber-modified cyanate ester concentrate containing a cyanate ester resin and a grafted rubber additive in an amount sufficient to provide a rubber-modified cyanate ester resin of the present invention when mixed with cyanate ester resin containing little or no grafted rubber additive.

A fourth aspect of the present invention is a process for creating a uniform dispersion of grafted rubber additive in cyanate ester resin, said process comprising the steps of:

1. contacting a grafted rubber additive, which contains a cross-linked rubber core having grafted thereto a resin-soluble polymer which is compatible with the cyanate ester resin, with an organic solvent, which can form a stable dispersion of the graft rubber additive without dissolving the rubber core or causing substantial swelling of the rubber core and can disperse uniformly with a cyanate ester resin or solution containing cyanate ester resin, under conditions such that a stable dispersion of the grafted rubber additive in the solvent is formed;

2. contacting the stable dispersion from step (1) with a cyanate ester resin and/or an organic solution containing a cyanate ester resin under conditions such that a uniform stable dispersion is formed; and 3. removing the solvent in a manner such that the grafted rubber additive remains uniformly dispersed throughout the cyanate ester resin.

Surprisingly, the rubber-modified polytriazines of this invention exhibit a substantial increase in toughness with less decrease in heat resistance than would ordinarily be expected. They can be prepared by curing the rubber-modified cyanate ester resins of this invention. The rubber particles are stabilized by the grafted polymer formed during the polymerization so that the particles remain in an essentially discrete, nonagglomerated form. The rubber particles are uniformly dispersed in the resin and the polytriazine prepared therefrom. The average rubber particle size, the distribution of particle sizes, the particle composition and the degree to which the particles are uniformly dispersed can be carefully controlled.

The rubber-modified polytriazines of this invention are useful for preparing advanced composites for aerospace structures and for preparing fiber-reinforced laminates, and for any other application where polytriazines are used.

DETAILED DESCRIPTION OF THE INVENTION

As the term is used herein, a cyanate ester resin is a monomer having at least one cyanate group. These monomers are well known in the art and are disclosed in U.S. Pat. Nos. 3,553,244; 3,740,348; and 3,755,402. Preferred cyanate ester resins are difunctional and polyfunctional aromatic polycyanates, which are disclosed in the patents referenced above and additionally in U.S. Pat. Nos. 3,448,079; 4,094,852; and 4,528,366. The preferred aromatic polycyanates are prepared from the polyhydric phenols of bisphenol A, bisphenol S, halogenated and alkylated analogs of bisphenol A and bisphenol S, novolak resins, cresols, polyphenols bridged by at least one polycyclic aliphatic group as described in U.S Pat. No. 4,528,366, and alkylated variations thereof. The most preferred cyanate ester resin has the following formula:

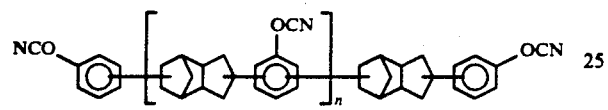

wherein the average value of n is about 0.2.

A process for preparing the most preferred cyanate ester resin and other preferred cyanate ester resins is disclosed in copending U.S. application Ser. No. 552,515, filed Nov. 16, 1983, now issued as Murray et al., *Preparation of Aromatic Cyanates*, U.S. Pat. No. 4,748,270 (May 31, 1988), which is incorporated herein by reference.

A polytriazine is the polymer formed by the trimerization of a cyanate ester resin. Included within the term are oligomers and prepolymers. Also included are copolymers of the cyanate ester resin and a monomer having at least one cyanate-reactive functionality. Examples of monomers with cyanate-reactive functionalities include but are not limited to epoxies, maleimides, and vinyl-terminated monomers.

The rubber particles of this invention preferably have diameters of about 300 Å to about 20,000 Å, more preferably from about 900 Å to about 2,000 Å. The particles form a colloidal dispersion in water if they are treated with a surfactant or emulsifier and tend to agglomerate if they are untreated.

The aqueous colloidal dispersion of discrete rubber particles maintained in a reasonably stable state with a surfactant or emulsifier is commonly referred to as a rubber latex. The preparation of rubber latexes is well known in the art and is disclosed, for example, in *The Vanderbilt Rubber Handbook*, Vanderbilt Co. Inc., (1978). For a good discussion of suitable surfactants and emulsifiers, see the paragraph bridging columns 3 and 4 of U.S. Pat. No. 4,421,660.

If desired, a bimodal distribution of rubber particles can be employed. A bimodal distribution is a distribution of large and small particles. This distribution is possible by agglomerating small particles or selectively growing small particles. In preferred embodiments, a bimodal distribution of grafted rubber particles dispersed in a cyanate ester resin exhibits a reduced viscosity relative to the viscosity exhibited by a uniform, or monodisperse, distribution of grafted rubber particles dispersed in the resin. The small particles preferably have diameters of about 900 Å to about 1500 Å, more preferably about 1000 Å, and the large particles preferably have diameters of about 4000 Å to about 10,000 Å, more preferably about 8000 Å.

The rubber particles are insoluble in (1) water, (2) the cyanate ester resin, and (3) any solvent for the cyanate ester resin. Examples of insoluble rubber particles are polyalkylenes, such as polyethylene; and polymers from alkyl esters of $\alpha,\beta$-ethylenically unsaturated monomers wherein the alkyl group has at least 4 carbon atoms, such as polybutyl acrylate or methacrylate, and poly(2-ethyl-1-hexyl)-acrylate or methacrylate.

In a preferred embodiment, rubber particles are crosslinked to render them insoluble. Crosslinked rubber particles form a gel and swell in the cyanate ester resin, but do not dissolve. The percent gel can range from about 50 to about 98 percent of the weight of the particles, more preferably from about 70 to about 95 percent, and the swelling index can range from about 3 to about 50, more preferably from about 10 to about 30. A method for determining the percent gel and swelling index is disclosed in U.S. Pat. No. 4,146,589. Examples of rubbers that can be crosslinked to render them insoluble include polybutadiene, styrene-butadiene copolymer, acrylate rubbers, neoprene, butyl rubber, nitrile rubber, acrylonitrile-butadiene-styrene (ABS) terpolymer, polyisoprene, ethylene-propylene copolymer (EPDM), fluoroelastomers, and mixtures of the above. Preferred rubber particles are crosslinked ABS terpolymer as described in the *Encyclopedia of Polymer Sciences and Engineering*, Vol. 2, 2nd ed., pp. 388–426 (1985), and crosslinked styrene-butadiene copolymer wherein the amount of butadiene in the copolymer ranges from about 50 to about 99 percent of the weight of the particles, more preferably from about 85 to about 95 percent.

Resin-soluble polymer moieties are grafted to the rubber particles. The resin-soluble polymer moiety is preferably the reaction product of an emulsion polymerization of suitable emulsion polymerizable monomers in the presence of an aqueous colloidal dispersion of rubber particles. The emulsion polymerizable monomers of this invention polymerize under emulsion polymerization conditions. The polymer formed is insoluble in water. It must be compatible in the cyanate ester resin; otherwise, uncontrolled agglomeration of the rubber particles can occur. Examples of suitable emulsion polymerizable monomers include vinyl aromatic monomers, such as styrene, vinyl toluene, and t-butyl styrene; $\alpha,\beta$-ethylenically unsaturated acids such as acrylic and methacrylic acid, and itaconic acid; alkyl esters of $\alpha,\beta$-ethylenically unsaturated acids wherein the alkyl group has less than 4 carbon atoms, such as methyl acrylate and methacrylate, and ethyl acrylate; hydroxyalkyl esters of $\alpha,\beta$-ethylenically unsaturated acids such as hydroxyethyl acrylate and methacrylate, and hydroxypropyl acrylate; unsaturated nitriles such as acrylonitrile; epoxy functional monomers such as glycidyl acrylate and methacrylate; and unsaturated esters of $\alpha,\beta$-ethylenically unsaturated acids such as allyl acrylate and methacrylate, and dicyclopentadiene acrylate and methacrylate; and mixtures of the above. Preferred monomer recipes are those containing mixtures of styrene, methyl methacrylate, and acrylonitrile. The most preferred monomer recipe further contains either allyl acrylate or dicyclopentadiene acrylate.

The emulsion polymerizable monomer and the rubber latex can be combined and emulsified by normal mixing procedures, for example, by passing both the monomer and the latex through a high shear mixing device such as a Waring blender, homogenizer, or ultrasonic mixer. Preferably, the monomer is added continuously to the rubber latex during the polymerization while the rubber latex is being stirred. The continuous monomer stream can be an aqueous emulsion of the monomer where the emulsion is maintained by a surfactant or emulsifier. As another alternative, the aqueous emulsion of rubber particles and monomer can be prepared by adding rubber particles to an aqueous emulsion of monomer. In such instances, it is desirable to add more surfactant or emulsifier prior to or during the addition of the rubber particles.

The amount of rubber particles in the emulsion desirably ranges from about 15 to about 65 percent of the weight of the emulsion, more preferably from about 20 to about 50 percent, and most preferably from about 30 to about 45 percent. The monomer is preferably present in an amount sufficient to graft onto essentially every rubber particle when the monomer is polymerized and to provide a grafted rubber additive having the desired ratio of ingredients. The weight of emulsion polymerizable monomer used is preferably at least about 5 percent of the weight of rubber particles and more preferably at least about 10 percent. The weight of emulsion polymerizable monomer is preferably at most about 150 percent of the weight of the rubber particles, highly preferably at most about 100 percent, more highly preferably at most about 50 percent, and most preferably at most about 30 percent. This amount can range from about 5 to about 50 percent of the weight of the rubber particles, more preferably from about 10 to about 30 percent. The surfactant or emulsifier is present in an amount sufficient to stabilize the aqueous dispersion of rubber particles. This amount can range from about 2 to about 5 percent of the weight of the rubber particles, more preferably from about 2 to about 3 percent. The remaining aqueous phase, which comprises water, initiator, and other additives, must be present in an amount sufficient to be the continuous phase of the emulsion.

The emulsion polymerization conditions of this invention are generally conventional free-radical type polymerizations carried out in the presence of a radical initiator such as a peroxygen compound, an azo compound, ultraviolet light and the like. Preferably, the polymerization is carried out in the presence of a water-soluble peroxygen compound at temperatures in the range from about 50° to about 90° C. The amount of free-radical initiator can range from about 0.005 to about 8 percent of the weight of the monomer, preferably from about 0.01 to about 5 percent. Examples of suitable initiators include inorganic persulfate compounds such as sodium persulfate, potassium persulfate, ammonium persulfate; peroxides such as hydrogen peroxide, t-butyl hydroperoxide, dibenzoyl peroxide and dilauroyl peroxide; azo compounds such as azobis-(isobutyronitrile), and other common free-radical generating compounds. Also suitable are various forms of free-radical generating radiation means such as ultraviolet radiation, electron beam radiation and gamma radiation. Alternatively, a redox initiator composition can be employed wherein the polymerization temperature ranges from about 25° to about 80° C. Exemplary redox initiator compositions include a peroxygen compound as described hereinbefore, preferably potassium persulfate or t-butyl hydroperoxide, and a reducing component such as sodium metabisulfite or sodium formaldehyde hydrosulfite.

Chain transfer agents can be employed to control the molecular weight of the graft polymer prepared during the polymerization. Examples include mercaptans such as dodecyl mercaptan, dialkyl xanthogen disulfides, diaryl disulfides, and others listed in Blackley, *Emulsion Polymerization*, Wiley and Sons, Chapter 8 (1975), in amounts as described therein. The weight average molecular weight of the graft polymer can vary and generally ranges from about 10,000 to about 250,000, more preferably from about 20,000 to about 100,000, as measured by gel permeation chromatography.

After the polymerization is complete, the rubber particles preferably make up at least about 45 weight percent of the grafted rubber additive, more preferably at least about 60 weight percent, and most preferably at least about 80 weight percent. The grafted resin-soluble polymer moieties preferably make up at least about 5 weight percent of the grafted rubber additive, more preferably at least about 10 weight percent, and most preferably at least about 15 weight percent. It preferably makes up no more than about 50 weight percent of the grafted rubber additive, more preferably no more than about 30 weight percent, and most preferably no more than about 20 weight percent.

The polymerization process unavoidably produces some ungrafted resin-soluble polymer. The ungrafted resin-soluble polymer lowers the glass transition temperature of the resulting resin but causes essentially no improvement or even a reduction in fracture toughness. The level of ungrafted resin-soluble polymer in the grafted rubber additive should, therefore, be minimized. The grafted rubber additive preferably comprises no more than about 30 weight percent ungrafted resin-soluble polymer, highly preferably no more than about 20 weight percent, more highly preferably no more than about 10 weight percent, and most preferably no more than about 1 weight percent. Ordinarily, higher concentrations of ungrafted resin-soluble polymer are obtained when the weight ratio of emulsion polymerizable monomer to rubber particles is high.

Following polymerization, the grafted rubber additive is dispersed throughout the cyanate ester resin to form a homogeneous dispersion of the particles in the resin. The grafted rubber additive can be dispersed in either liquid resins or solid resins after the resin is melted or placed in solution. Preferably, the grafted rubber additive is dispersed in an organic solvent that is compatible with the cyanate ester resin and does not dissolve or unduly swell the rubber. The dispersion is then mixed with the cyanate ester resin or an organic solution which contains cyanate ester resin, and the solvent is removed to leave the dispersion of the present invention.

The optimum solvent for the dispersion process varies depending upon the cyanate ester resin and the grafted rubber additives, and can be readily determined without undue experimentation. Examples of suitable solvent include lower molecular weight ($C_1$-$C_6$) aliphatic ketones, alcohols and halogenated compounds. Methyl ethyl ketone is a particularly useful solvent for many grafted rubber additives and many cyanate ester resins. The grafted rubber additive may be dried and isolated as a solid before it is dispersed in the solvent, or may be extracted from an aqueous dispersion using the solvent. The mixing may take place at any temperature and pressure at which dispersion will occur. Thereafter, the solvent should be drawn off at a temperature which does cause the cyanate ester resin to cure prematurely.

The grafted rubber additive may be added to cyanate ester resin either in an amount suitable to make a cured polytriazine having improved toughness or in an amount suitable to make a concentrate which is later dispersed throughout a cyanate ester resin containing little or no grafted rubber additive. In rubber-modified cyanate ester resin suitable for curing, the concentration of grafted rubber additive should be high enough to provide the desired level of fracture energy and low enough that the cured polytriazine maintains a desired resistance to softening with temperature. The cured polytriazine containing a less preferred grafted rubber additive, which has high levels of ungrafted resin-soluble polymer, may exhibit two glass transition temperatures, as measured by dynamic mechanical spectroscopy. It should, however, retain sufficient mechanical integrity for the test to be run up to the second glass transition temperature.

The weight percent of rubber particles in rubber-modified cyanate ester resins of the present invention is at least about 6 percent, more preferably at least about 8 percent, and is preferably no more than about 25 percent, more preferably no more than about 15 percent, and most preferably no more than about 12 percent. The weight of ungrafted resin-soluble polymer in the rubber-modified cyanate ester resin is no more than about 10 percent, preferably no more than about 7 percent, more preferably no more than about 5 percent, and most preferably no more than about 1 percent. The concentration of preferred grafted rubber additives in cyanate ester resin preferably ranges from about 0.1 to about 30 percent of the weight of the cyanate ester resin. Amounts below 0.1 percent will not provide an appreciable increase in toughness and amounts above 30 percent could adversely affect the stiffness or rigidity of the polytriazine. Amounts ranging from about 2.5 to about 20 percent are preferred. Concentrates contain an amount of grafted rubber additive sufficient for the concentrate to be mixed with a cyanate ester resin containing little or no grafted rubber additive in order to obtain a rubber-modified cyanate ester resin with a concentration of grafted rubber additive as defined above. The grafted rubber additive is preferably at least about 10 weight percent of the concentrate and preferably no more than about 25 weight percent of the concentrate.

Additives that improve the physical and chemical properties of the polytriazine can be incorporated into the cyanate ester resin in minor amounts before cure. For example, antioxidants can be added to improve the thermal stability of the grafted rubber and polytriazine.

The homogeneous dispersion of grafted rubber particles and cyanate ester resin are cured to form the rubber-modified polytriazine. The dispersion is cured in a manner similar to the curing of a cyanate ester resin that does not contain a dispersion of grafted rubber particles. The dispersion can be cured thermally without the use of a catalyst. Preferably, a catalyst is used. U.S. Pat. Nos. 3,694,410; 4,094,852; and 4,528,366 disclose suitable catalysts. Preferred catalysts are cobalt catalysts such as cobalt acetylacetonate, cobalt octoate, and cobalt naphthenate. The amount of catalyst can range from about 10 ppm to about 1000 ppm based on the weight of cyanate ester resin.

The rubber-modified polytriazines of this invention exhibit dramatically improved toughness without a significant reduction in heat resistance. This improvement is possible because the rubber particles are grafted with a polymer that maintains the particles in a discrete, spaced apart relationship to each other when the particles are incorporated into the cyanate ester resin and cured. The particles have a uniform particle size and are uniformly distributed. This ideal morphology allows the particles to substantially increase the toughness without sacrificing the heat resistance of the polytriazine.

The following examples are illustrative and does not limit the scope of this invention. Unless otherwise stated, all parts and percentages are by weight.

EXAMPLE 1

In each of a series of runs, 1014 grams (g) of a rubber latex containing 300 g of rubber particles are charged into a two-liter, 3-neck, roundbottom glass flask equipped with a mechanical stirrer, temperature controller, and reflux condenser with a nitrogen inlet. The rubber particles are crosslinked styrene-butadiene copolymer (7 percent styrene, 93 percent butadiene) having an average diameter of 1100 Å as measured by a Brice Phoenix Light Scattering Unit. The particles are stabilized in the latex with 3 percent sodium dodecylbenzene sulfonate soap. 0.56 Grams of 2,2-azobis-(isobutyronitrile) is added to the flask and the contents are agitated at 150 rpm. The reactor is flushed with nitrogen and is heated with the aid of a water bath to a temperature of 70° C.

For each run, about 56.3 g of a monomer stream having one of the compositions disclosed as Samples 1–6 in Table I is added to the reactor and is emulsified in the rubber latex. Twenty percent of the monomer stream is initially added continuously at 70° C. at a rate of 0.075 g per minute for 150 minutes. After this addition, the reactor temperature is raised to 80° C. and the remaining monomer stream is added continuously over a 90 minute period. The reaction mixture is heated at 80° C. for an additional 2 hours, and then is allowed to cool before being transferred to another flask. The rubber latex is vacuum stripped to remove any unreacted monomers. The resulting grafted rubber latex contains 32.3 percent solids and has an average particle diameter of 1200 Å. as measured by a Brice Phoenix Light Scattering Unit.

The grafted rubber latex is diluted with methylethylketone (MEK) and water. The diluted mixture is allowed to settle and the bottom aqueous layer is removed. The top layer is washed 4 times with an aqueous solution of 25 percent MEK to remove the ionic soap and salts.

For each run, the most preferred cyanate ester resin is dissolved in the MEK dispersion of grafted rubber particles in an amount sufficient to bring the grafted rubber content to 5 percent of the total weight of the combination of the grafted rubber particles and the resin. The solvent and any remaining water are then vacuum stripped to yield a dispersion of the grafted rubber in the cyanate ester resin wherein the grafted rubber content is 5 percent of the dispersion.

A solution of cobalt acetylacetonate in acetonitrile is added to the dispersion to bring the total cobalt concentration to about 100 parts per million based on the weight of the cyanate ester resin. The resulting mixture is then cured in a mold for 1 hour at 175° C., 2 hours at 225° C. and 0.5 hours at 250° C. The resulting rubbermodified polytriazine is then machined into test specimens.

The identical procedure for preparing the rubber-modified polytriazine is repeated at least once for each run, except that the grafted rubber content of the cyanate ester resin is varied. The physical properties for each specimen are analyzed and the results are disclosed in Table II.

TABLE I

| Sample | Composition of Monomer Stream Weight Percent of Each Monomer Component | | | | | |
|---|---|---|---|---|---|---|
|  | S[1] | MMA[2] | AN[3] | GMA[4] | AA[5] | DCPDA[6] |
| 1 | 30 | 30 | 25 | 15 | — | — |
| 2 | 30 | 30 | 25 | — | 15 | — |
| 3 | 30 | 30 | 25 | — | — | 15 |
| 4 | 55 | — | 30 | — | — | 15 |
| 5 | 45 | 15 | 25 | — | — | 15 |
| 6 | 37.5 | 37.5 | 25 | — | — | — |

S = Styrene; MMA = Methyl methacrylate; AN = Acrylonitrile; GMA = Glycidyl methacrylate; AA = Allyl Acrylate; DCPDA = Dicyclopentadiene acrylate.

TABLE II

Properties of Rubber-Modified Polytriazines

| Sample From Which Grafted Rubber Latex is Derived | Grafted Rubber Content of Dispersion of Modified Cyanate Ester Resin (Weight Percent) | $T_g$[1] (°C.) of Rubber Modified Polytriazine | $G_{IC}$[2] (J/m$^2$) of Rubber-Modified Polytriazine |
|---|---|---|---|
| Control* | 0 | 248 | 60 |
| 1 | 5 | 235 | 290 |
| 1 | 10 | 235 | 490 |
| 2 | 5 | 237 | 340 |
| 2 | 10 | not measured | 560 |
| 3 | 5 | 234 | 340 |
| 3 | 10 | not measured | 560 |
| 4 | 2.5 | 240 | 190 |
| 4 | 5 | 236 | 390 |
| 4 | 10 | not measured | 720 |
| 5 | 5 | not measured | 420 |
| 5 | 10 | not measured | 720 |
| 6 | 2.5 | 254 | 200 |
| 6 | 5 | 253 | 320 |
| 6 | 10 | 255 | 630 |

*Not an example of this invention
[1]$T_g$ is the glass transition temperature as measured by dynamic mechanical spectroscopy.
[2]$G_{IC}$ is the fracture energy as measured by compact tension according to ASTM procedure E-399

The data in Table II indicates a dramatic increase in the fracture energy of the rubber-modified polytriazines relative to the fracture energy of the unmodified polytriazine (control). The results shown in Table II also indicate little or no decrease in the glass transition temperature of the rubber-modified polytriazines relative to the glass transition temperature of the unmodified polytriazine.

EXAMPLE 2

A grafted rubber additive, which comprises by weight about 47 percent cross-linked styrene-butadiene (SB) copolymer rubber particles, about 23 percent grafted styrene-acrylonitrile (SAN) copolymer and about 30 percent ungrafted SAN copolymer, is dispersed in methyl ethyl ketone. The dispersion is blended with cyanate ester resin used in Example 1. The methyl ethyl ketone is removed. The process is repeated using varying concentrations of the grafted rubber additive to provide rubber-modified cyanate ester resin containing from about 4 percent to about 10 percent rubber particles. (Samples containing less than 6 percent rubber particles are for illustrative purposes only). The procedure is also repeated using 10, 20 and 30 weight percent of a commercial ABS resin containing cross-linked SB rubber copolymer, grafted SAN copolymer and ungrafted SAN copolymer, wherein the SB rubber copolymer makes up from 5 to 25 weight percent of the ABS resin and ungrafted SAN copolymer makes up at least 50 percent of the ABS resin. The fracture energy and glass transition temperature of each sample are shown in Table III hereinafter.

TABLE III

| Sample No. | Additive[1] | Weight % Additive | Weight % Rubber | $G_{IC}$ (J/m$^2$) | $T_g$ (°C.) |
|---|---|---|---|---|---|
| 1* | GRA | 8.94 | 4.2 | 237 | 110/245 |
| 2* | GRA | 10.0 | 4.7 | 243 | 110/250 |
| 3 | GRA | 17.8 | 8.4 | 430 | 110/255 |
| 4 | GRA | 20.0 | 9.4 | 457 | 110/255 |
| 5* | ABS | 10.0 |  | 236 | 105/235 |
| 6* | ABS | 20.0 |  | 120 | 110 |
| 7* | ABS | 30.0 |  | 146 | 110 |

*indicates that the sample is not an example of the invention.
[1]GRA indicates that the additive is the grafted rubber additive previously described.
ABS indicates that the additive is the commercial ABS resin previously described.

What is claimed is:

1. A rubber-modified cyanate ester resin comprising a major portion of cyanate ester resin and a minor portion of grafted rubber additive which contains:
   1. resin-insoluble rubber particles;
   2. resin-soluble polymer moieties grafted to the resin-insoluble rubber particles; and
   3. optionally ungrafted resin-soluble polymer moieties wherein the concentration of grafted rubber additive and the ratio of components is such that:
   the concentration of resin-insoluble rubber particles in the rubber-modified cyanate ester resin is at least about 6 weight percent,
   the concentration of ungrafted resin-soluble polymer in the rubber-modified cyanate ester resin is at most about 10 weight percent,
   the rubber particles are maintained in a discrete spaced apart relationship to each other, and
   the grafted rubber additive and cyanate ester resin can be dispersed in a compatible solvent.

2. The rubber-modified cyanate ester resin of claim 1 wherein the cyanate ester resin is a difunctional or polyfunctional aromatic polycyanate.

3. The rubber-modified cyanate ester resin of claim 2 wherein the aromatic polycyanate is prepared from a polyhydric phenol selected from the group consisting of bisphenol A, bisphenol S, a halogenated or alkylated analog of bisphenol A or bisphenol S, a novolak resin, polyphenol bridged by at least one polycyclic aliphatic group or an alkylated variation thereof.

4. The rubber-modified cyanate ester resin of claim 3 wherein the cyanate ester resin has the formula:

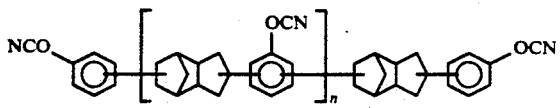

wherein the average value of n is about 0.2.

5. The rubber-modified cyanate ester resin of claim 1 wherein the grafted rubber additive comprises between at least 45 weight percent cross-linked rubber copolymer, between 5 and 50 weight percent grafted resin-soluble polymer, and no more than about 30 weight percent ungrafted resin-soluble polymer.

6. The rubber-modified cyanate ester resin of claim 5 wherein the rubber particles have diameters of about 300 Å to about 20,0000 Å.

7. The rubber-modified cyanate ester resin of claim 6 wherein rubber particles make up at least about 7 weight percent of the rubber-modified cyanate ester resin.

8. The rubber-modified cyanate ester resin of claim 6 wherein rubber particles make up at least about 8 weight percent of the rubber-modified cyanate ester resin.

9. The rubber-modified cyanate ester resin of claim 8 wherein grafted resin-soluble polymer makes up between 10 and 30 weight percent of the grafted rubber additive.

10. The rubber-modified cyanate ester resin of claim 9 wherein grafted resin-soluble polymer makes up between 15 and 20 percent of the grafted rubber additive.

11. The rubber-modified cyanate ester resin of claim 10 wherein the rubber particles make up at least about 60 percent of the grafted rubber additive.

12. The rubber-modified cyanate ester resin of claim 11 wherein the rubber particles make up at least about 80 percent of the grafted rubber additive.

13. The rubber-modified cyanate ester resin of claim 9 wherein the concentration of ungrafted resin-soluble polymer is no more than about 7 weight percent of the rubber-modified cyanate ester resin.

14. The rubber-modified cyanate ester resin of claim 13 wherein the concentration of ungrafted resin-soluble polymer is no more than about 5 weight percent of the rubber-modified cyanate ester resin.

15. The rubber-modified cyanate ester resin of claim 9 wherein the rubber-modified cyanate ester resin contains between 10 and 30 weight percent grafted rubber additive.

16. The rubber-modified cyanate ester resin of claim 9 wherein the rubber-modified cyanate ester resin is a concentrate comprising at least about 10 weight percent rubber particles.

17. The rubber-modified cyanate ester resin of claim 9 wherein the rubber-modified cyanate ester resin comprises no more than about 25 weight percent rubber particles.

18. The rubber-modified cyanate ester resin of claim 9 wherein the rubber particles of the grafted rubber additive are cross-linked styrene-butadiene rubber copolymer and the resin-soluble polymer is styrene-acrylonitrile copolymer.

19. A rubber-modified polytriazine polymer comprising a continuous polytriazine phase and a discontinuous grafted rubber additive phase which contains:
1. resin-insoluble rubber particles;
2. resin-soluble polymer moieties grafted to the resin-insoluble rubber particles; and
3. optionally ungrafted resin-soluble polymer moieties
wherein the concentration of grafted rubber additive and the ratio of components is such that:
the concentration of resin-insoluble rubber particles in the rubber-modified polytriazine is at least about 6 weight percent,
the concentration of ungrafted resin-soluble polymer in the rubber-modified polytriazine is at most about 10 weight percent, and
the rubber particles are maintained in a discrete spaced apart relationship to each other by the resin-soluble polymer.

20. The rubber-modified polytriazine of claim 19 wherein the polytriazine is the product of a difunctional or polyfunctional aromatic polycyanate.

21. The rubber-modified polytriazine of claim 20 wherein the polytriazine is the product of an aromatic polycyanate prepared from a polyhydric phenol selected from the group consisting of bisphenol A, bisphenol S, a halogenated or alkylated analog of bisphenol A or bisphenol S, a novolak resin, a cresol, a polyphenol bridged by at least one polycyclic aliphatic group, or an alkylated variation of one of those groups.

22. The rubber-modified polytriazine of claim 21 wherein the polytriazine is the product of a cyanate ester resin which has the formula:

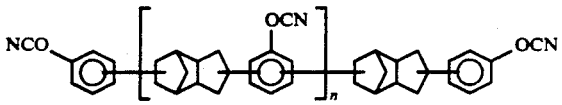

wherein the average value of n is about 0.2.

23. The rubber-modified polytriazine of claim 19 wherein the grafted rubber additive comprises between at least 45 weight percent cross-linked rubber copolymer, between 5 and 50 weight percent grafted resin-soluble polymer, and no more than about 30 weight percent ungrafted resin-soluble polymer.

24. The rubber-modified polytriazine of claim 23 wherein the rubber particles have diameters of about 300 Å to about 20,0000 Å.

25. The rubber-modified polytriazine of claim 24 wherein rubber particles make up between about 7 and about 25 weight percent of the rubber-modified polytriazine.

26. The rubber-modified polytriazine of claim 25 wherein rubber particles make up at least about 8 weight percent of the rubber-modified polytriazine.

27. The rubber-modified polytriazine of claim 26 wherein grafted resin-soluble polymer makes up between 10 and 30 weight percent of the grafted rubber additive.

28. The rubber-modified polytriazine of claim 27 wherein grafted resin-soluble polymer makes up between 15 and 20 percent of the grafted rubber additive.

29. The rubber-modified polytriazine of claim 28 wherein the rubber particles make up at least about 60 percent of the grafted rubber additive.

30. The rubber-modified polytriazine of claim 29 wherein the rubber particles make up at least about 80 percent of the grafted rubber additive.

31. The rubber-modified polytriazine of claim 27 wherein the concentration of ungrafted resin-soluble polymer is no more than about 7 weight percent of the rubber-modified polytriazine.

32. The rubber-modified polytriazine of claim 31 wherein the concentration of ungrafted resin-soluble polymer is no more than about 5 weight percent of the rubber-modified polytriazine.

33. The rubber-modified polytriazine of claim 27 wherein the rubber-modified polytriazine contains between 10 and 30 weight percent grafted rubber additive.

34. The rubber-modified polytriazine of claim 27 wherein the rubber particles of the grafted rubber additive are cross-linked styrene-butadiene rubber copolymer and the resin-soluble polymer is styrene-acrylonitrile copolymer.

35. A process for creating a uniform dispersion of grafted rubber additive in cyanate ester resin, said process comprising the steps of:
1. contacting a grafted rubber additive, which contains a cross-linked rubber core having grafted thereto a resin-soluble polymer which is compatible with the cyanate ester resin, with an organic solvent, which can form a stable dispersion of the graft rubber additive without dissolving the rubber core or causing substantial swelling of the rubber core and can disperse uniformly with a cyanate ester resin or solution containing cyanate ester resin, under conditions such that a stable dispersion of the grafted rubber additive in the solvent is formed;
2. contacting the stable dispersion from step (1) with a cyanate ester resin and/or an organic solution containing a cyanate ester resin under conditions such that a uniform stable dispersion is formed; and
3. removing the solvent in a manner such that the grafted rubber additive remains uniformly dispersed throughout the cyanate ester resin.

* * * * *